ELECTRON BEAM MASKING FOR ETCHING ELECTRICAL CIRCUITS

Filed Jan. 31, 1961

HORACE T. MANN
INVENTOR.
BY Jerry A. Dinardo
AGENT
Albert Rosen
ATTORNEY.

United States Patent Office 3,113,896

Patented Dec. 10, 1963

3,113,896

ELECTRON BEAM MASKING FOR ETCHING ELECTRICAL CIRCUITS

Horace T. Mann, Palos Verdes Estates, Calif., assignor to Space Technology Laboratories, Inc., Los Angeles, Calif., a corporation of Delaware Filed Jan. 31, 1961, Ser. No. 86,102

15 Claims. (Cl. 156—3)

This invention relates to improvements in the art of forming etched patterns on an object, such as forming etched electrical circuits.

Present methods of forming etched patterns of metal such as electrically conductive circuits involve the provision of a base coating of metal, such as copper, on an insulating substrate. The base coating of metal is then covered with a photoresist material, and the latter is photographically exposed through a mask which is provided with openings that correspond to the desired pattern.

The areas of the photoresist struck by the light are rendered insoluble, whereas the masked unsensitized portions of the photoresist remain soluble in a solvent, such as alcohol. The nonsensitized areas are next dissolved away and the uncoated base metal is treated with an etching agent that removes the unprotected areas of base metal to form the desired metal pattern.

The foregoing method has not proved entirely satisfactory for various reasons. In the first place, there is some difficulty encountered in applying the photoresist. When the photoresist is applied by painting, there is a tendency for brush marks to appear. If spraying is resorted to, there is a tendency towards bubble formation. In a flowing process, it is rather difficult to provide a coating of uniform thickness.

Secondly, the photographic exposure tends to leave fuzzy rather than well defined edges in the resist pattern, either because of light scattering by the mask openings or because of uneven penetration of the light into the resist.

Thirdly, there is a limitation in the number of different etching agents for the base metal which will not attack the resist.

Accordingly, a principal object of this invention is to provide a simplified method of forming etched patterns of metal, such as etched electrical circuits.

A further object is to provide a method of forming conductive patterns by selective removal of metal areas, which method eliminates the use of a photographic resist.

The foregoing and other objects are realized in accordance with the invention through the use of a polymerized film deposited in a pattern on a base metal followed by the selective removal of the base metal in those areas not covered by the polymerized film.

In accordance with one embodiment of the invention the polymerized film pattern is formed by bombarding the base metal with a relatively wide angle electron beam in the presence of a polymerizable vapor, with the beam passing through a multi-apertured mask to confine the film deposit to predetermined areas of the base metal.

In accordance with another embodiment of the invention the polymerized film pattern is formed by directing a relatively narrow electron beam first on one predetermined area and then on another area of the base metal, as by a programmed scanning movement.

In both embodiments, the electron beams cause the polymerized film pattern to be precisely formed, both as to thickness uniformity and as to sharpness of detail. As a result, when the uncoated base metal is removed by etching, the metal pattern that remains is produced with corresponding precision.

Figures 1, 2, 3, 4, 5:
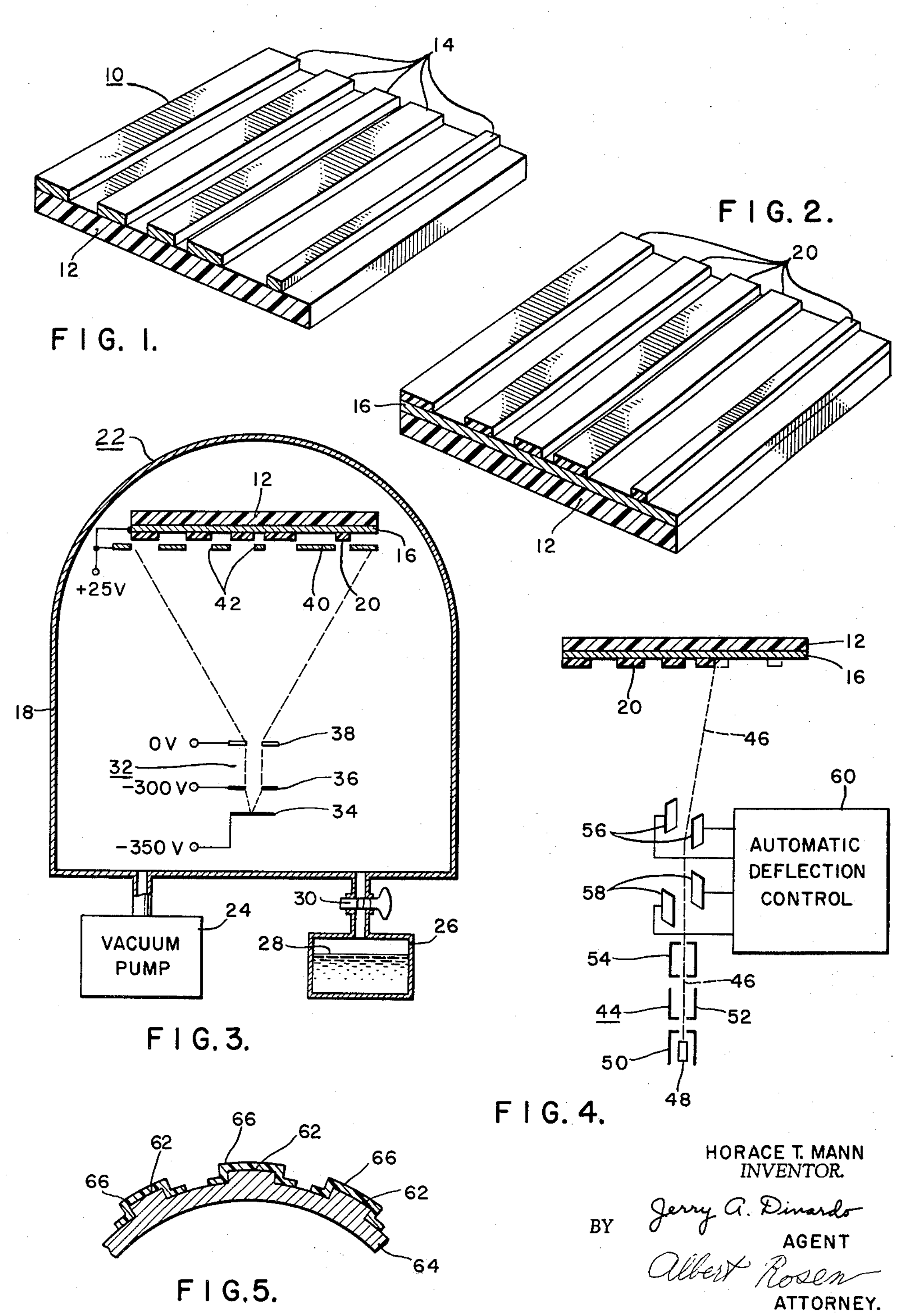
FIG. 1 is a partial perspective view partly in section of an electrical circuit assembly fabricated according to the method of the invention.
FIG. 2 is a partial perspective view partly in section of the electrical circuit assembly of FIG. 1 shown during one stage of fabrication according to the invention.
FIG. 3 is a diagrammatic view of electron beam polymerization apparatus useful in carrying out the method of the invention.
FIG. 4 is a diagrammatic view of a modified portion of the apparatus of FIG. 3.

FIG. 1 shows an article of manufacture of the kind particularly suited for fabrication in accordance with the method of the invention. Illustratively, the article shown is an etched electrical circuit assembly 10 comprised of an insulating substrate or sheet 12 on one surface of which is bonded a pattern of electrical conductors 14. For the sake of simplicity the conductors 14 are shown as being straight. However, it is understood that they may have other configurations, such as bent or curved, for example. Furthermore, while the substrate 12 is shown as having a flat surface it may take a curved or an irregular shape.

The insulating sheet 12 may be formed of a plastic or of any other suitable insulation material well known in the printed circuit art. The conductors 14 are preferably formed of copper, tin, silver or other suitable electrical conductor. In fabricating the conductors 14, a thin uniform layer of desired base metal is first applied to the insulating sheet 12. The base metal may be applied by well known vacuum deposition techniques or any other suitable method that will produce a firmly adherent metal coating. Subsequently, portions of the base metal layer are removed from the insulating sheet 12 in accordance with certain processing steps that will be described, so as to produce the desired pattern of conductors 14.

In carrying out the method of the invention, the insulating sheet 12 is coated with a uniform layer 16 of base metal, shown in FIG. 2, from which the conductors of FIG. 1 are ultimately formed. Referring to FIG. 3, the metal coated insulating sheet 12 is then placed in a vacuum chamber 18 for the reception on the base metal layer 16 of a polymerized film 20. The polymerized film 20 is deposited in the form of a pattern corresponding in plan view to the desired pattern of the conductors 14 shown in FIG. 1.

The vacuum chamber 18 is part of a vacuum deposition apparatus 22 which includes a vacuum pump 24 for evacuating the chamber 18. A reservoir 26 holding a polymerizable liquid 28, such as a silicone oil, is connected to another part of the chamber 18 through a valve 30 which controls the flow of vapor of the polymerizable liquid 28 into the chamber 18. An electron gun 32 including a cathode 34, a control grid 36, and an accelerating anode 38, are mounted in the lower part of the chamber 18. The electron gun 32 is arranged to project a beam of electrons onto the metal coated insulating sheet 12 mounted in the upper part of the chamber 18. A mask 40 provided with openings 42 conforming to the polymerized film pattern to be deposited is mounted in front of the base metal layer 16. The mask 40 and base metal layer 16 may be electrically connected together, as shown, or a small positive or negative bias may be established between them.

The polymerized film 20 is applied by means of a procedure which comprises bombarding the metal coated insulating sheet 12 with an electron beam passing through an atmosphere of a polymerizable substance. According to this procedure, a vacuum of at least $1\times10^{-4}$ millimeters of mercury is established in the chamber 18. Next, vapors from the polymerizable liquid 28, such as a silicone oil, or a siloxane such as polydimethylsiloxane, are introduced into the chamber 18. This may be done by heating the liquid 28 to at least 100 degrees centigrade to vaporize the liquid until it reaches an equilibrium condition with the gases which remain in the vacuum system when the total vacuum pressure is $1 \times 10^{-4}$ millimeters of mercury or lower. The electron gun 32 is then turned on to subject the metal layer 16 to electron bombardment. It is believed that the energy of the electrons passing through the openings 42 of the mask 40 and striking those portions of the metal layer 16 in register with the mask openings 42 has the effect of cross linking the vapor molecules of the silicone oil which have deposited on the metal layer 16 to form a tightly adherent layer constituting the polymerized film 20.

In this embodiment, the electron beam may be fixed or movable relative to the insulating sheet 12. If it is fixed, the angle of divergence of the beam should be wide enough to cover all the openings of the mask. If it is made movable, then the beam can have a smaller angle, and the mask openings alone or the entire mask can be scanned by the beam to produce the desired pattern.

With the anode 38 of the electron gun 32 maintained at zero or ground reference potential, it has been found that a satisfactory polymerized film 20 can be formed by applying potentials of −300 volts to the control grid 36, −350 volts to the cathode 34, and +25 volts to the metal layer 16. The polymerized film 20 is preferably made from 50 to 200 angstrom units in thickness, or thicker if desired. Under the voltage conditions specified the pattern of polymerized film 20 is formed precisely under the mask openings 42, the edges of the film 20 contiguous with the base metal layer 16 being very sharply defined and intimately bonded to the base metal layer 16.

The pattern of polymerized film 20 is now used as a resist or mask to define the configuration of the metal conductors 14. Accordingly, the assembly comprising the base metal layer 16 coated with the polymerized film 20 is treated with an etching agent, such as ferric chloride. The etching solution selected is one in which the base metal is soluble and the polymer is insoluble. As a result, those portions of the base metal layer 16 not covered by the polymerized film 20 are dissolved by the etching solution while the covered portions remain intact. Since the edges of the polymerized film 20 pattern are very sharp and precise and are firmly bonded to the base metal layer 16 the covered portions of the base metal layer 16 that remain to form the conductors 14 are an exact replica of the polymerized film 20 pattern.

While ferric chloride is found to satisfactorily remove the unprotected areas of the base metal layer 16, it has been found that many other chemical agents are available to remove the base metal without affecting the polymerized film 20. The wide choice of chemical agents is due to the fact that the polymerized film 20 is highly resistant to chemical attack. Where copper is used for the base metal layer 16, for example, hydrochloric acid or sulfuric acid may be used in place of the ferric chloride. Where lead is used for the base metal layer 16 hydrochloric or acetic acids may be used. For silver, hydrochloric or sulfuric acids are suitable etching agents.

After conductors 14 are formed, the assembly is washed to remove any traces of the etching solution and then dried. Finally, the polymerized film 20 may be removed by an abrading means. Alternatively, the film 20 can be left on the conductors 14 to serve as a protective coating therefor.

In an alternative method, the mask 40 illustrated in FIG. 3 may be dispensed with. As shown in FIG. 4, a different electron gun 44 is used; this gun 44 providing a relatively narrow focussed electron beam 46. The electron gun 44 may be of the electrostatic focus type which includes a cathode 48, a control grid 50, and first and second accelerating anodes 52 and 54 respectively. Typical operating potentials may be established by applying −1000 volts on the cathode 48, −1005 volts on the control grid 50, −500 volts on the first anode 52, zero volts on the second anode 54 and on the base metal layer 16.

In this embodiment, the polymerized film 20 pattern is formed by scanning the electron beam 46 over the base metal layer 16. For this purpose, electrostatic deflection means in the form of a pair of horizontal deflection plates 56 may be provided to move the beam in a horizontal direction and a pair of vertical deflection plates 58 may be provided to move the beam in a vertical direction. The speed and direction of the beam movement may be determined in advance and may be arranged to respond automatically to a deflection control means 60, illustrated generally in block form. The deflection control means 60 may includes means for applying a deflection voltage in the neighborhood of 500 volts between each pair of deflection plates 56 and 58. The electron beam 46 may traverse several overlapping courses or as many courses as are necessary to form a desired width portion of the polymerized film 20. If the beam 46 is scanned uniformly over the base metal layer 16, it is necessary to control the film 20 deposition by turning the beam 46 off when scanning areas where no film 20 is desired. Such control is conveniently achieved by applying a high positive voltage to the cathode 48 or a high negative voltage to the control grid 50, of sufficient magnitudes to extinguish the electron beam 46.

It has been found especially advantageous to coat curved or irregularly shaped surfaces with an electron beam polymerized film according to the invention. In this connection, successful results are achieved through the ability of the electron beam to cover even the sharpest surface irregularities, such as may be found on an ornamental object. As shown in FIG. 5, for example, the promontories 62 of a curved metal member 64 may be completely coated with spaced polymerized film elements 66. Thereafter the assembly may be treated with a chemical agent to etch through a partial thickness of the exposed metal to form an ornamental design, or through the entire thickness to produce a multiplicity of small metal objects.

It is now apparent that the invention provides a simplified method of forming etched patterns on a metal object. The improved method may be used in fabricating etched electrical circuits or in forming decorative patterns on an object.

The embodiments of the invention in which an exclusive property or privilege is claimed are defined as follows:

1. A method of forming a pattern of electrically conductive elements, said method comprising coating a substrate with an electrically conductive layer, continuously depositing vapor molecules, of a polymerizable substance on said coated substrate within a vacuum chamber, concurrently exposing said conductive layer to a pattern of electrons of sufficient energy to cause polymerization of said continuously deposited vapor molecules on areas of said conductive layer impinged by said electrons, thereby to form a polymerized film pattern on said conductive layer, and removing areas of said conductive layer free from said polymerized film by subjecting said conductive layer and polymerized film to a chemical agent in which the material of said conductive layer is soluble and in which said polymerized film is insoluble, thereby to leave a pattern of conductive elements on said substrate.

2. The invention according to claim 1, wherein said electron pattern is produced by projecting an electron beam through a masking member, provided with openings corresponding to the desired pattern.

3. The invention according to claim 1, wherein said electron pattern is produced by scanning an electron beam across said conductive layer in accordance with a predetermined program.

4. A method of forming a pattern of electrically conductive elements, said method comprising coating a substrate with an electrically conductive layer, continuously depositing vapor molecules, of a silicon oil on said coated substrate within a vacuum chamber, concurrently exposing said conductive layer to a pattern of electrons of sufficient energy to cause polymerization of said continuously deposited vapor molecules on areas of said conductive layer impinged by said electrons, thereby to form a polymerized film pattern on said conductive layer, and removing areas of said conductive layer free from said polymerized film by subjecting said conductive layer and polymerized film to a chemical agent in which the material of said conductive layer is soluble and in which said polymerized film is insoluble, thereby to leave a pattern of conductive elements on said substrate.

5. The invention according to claim 4, wherein said chemical agent comprises ferric chloride.

6. A method of forming a pattern of electrically conductive elements, said method comprising coating a substrate with an electrically conductive layer, introducing said coated substrate in a vapor atmosphere of polydimethylsiloxane, exposing said conductive layer to a pattern of electrons of sufficient energy to cause polymerization of said polydimethylsiloxane on areas of said conductive layer impinged by said electrons, thereby to form a polymerized film pattern on said conductive layer, and removing areas of said conductive layer free from said polymerized film by subjecting said conductive layer and polymerized film to a chemical agent in which the material of said conductive layer is soluble and in which said polymerized film is insoluble, thereby to leave a pattern of conductive elements on said substrate.

7. A method of forming a pattern of electrically conductive elements, said method comprising coating a substrate with an electrically conductive layer, introducing said coated substrate in a vapor atmosphere of a polymerizable substance, mounting an electron impervious masking member adjacent to said conductive layer, said masking member being provided with electron pervious areas corresponding to said pattern, projecting a beam of electrons through the electron pervious areas of said masking member and onto said conductive layer, said electrons being of sufficient energy to cause polymerization of said substance on areas of said conductive layer impinged by said electrons, thereby to form a polymerized film pattern on said conductive layer, and removing areas of said conductive layer free from said polymerized film by subjecting said conductive layer and polymerized film to a chemical agent in which the material of said conductive layer is soluble and in which said polymerized film is insoluble, thereby to leave a pattern of conductive elements on said substrate.

8. The invention according to claim 7, and further including the step of removing said polymerized film pattern following the formation of said pattern of conductive elements.

9. A method of forming a pattern of electrically conductive elements on an insulating substrate, said method comprising: coating said substrate with an electrically conductive layer, coating said conductive layer with a layer of polymerized silicone formed into a pattern corresponding to the pattern of conductive elements by concurrently depositing vapor molecules of said silicone on said coated substrate and bombarding said vapor molecules with low energy electrons of approximately several hundred to a thousand electron volts, removing areas of said conductive layer free from said polymerized silicone by exposing them to a solvent in which said material of said conductive layer is soluble but in which said polymerized silicone is insoluble, thereby leaving the desired pattern of conductive elements, and removing said polymerized silicone layer.

10. A method of forming a pattern of electrically conductive elements, said method comprising coating a substrate with an electrically conductive layer, continuously depositing vapor molecules of a polymerizable substance on said coated substrate within a vacuum chamber, concurrently exposing said conductive layer to a pattern of electrons having an energy of the order of several hundred electron volts to cause solidification of said substance on areas of said conductive layer impinged by said electrons, thereby to form a tightly adherent film pattern, and removing areas of said conductive layer free from said film by subjecting said conductive layer and film to a chemical agent in which the material of said conductive layer is soluble and in which the material of said film is insoluble, thereby to leave a pattern of conductive elements on said substrate.

11. A method of forming a desired pattern on a metal member, said method comprising: continuously depositing vapor molecules of a polymerizable substance on said metal member in a vacuum chamber, concurrently exposing said metal member to a pattern of electrons having an energy of the order of several hundred electron volts to cause solidification of said substance on areas of said metal member impinged by said electrons, thereby to form a tightly adherent film pattern, and removing areas of said metal member free from said film by subjecting said metal member and film to a chemical agent in which the metal of said member is soluble and in which said film is insoluble, thereby to leave the desired pattern on said metal member.

12. The invention according to claim 11, and further including the step of removing said film following the formation of said desired metal pattern.

13. The invention according to claim 11, wherein said polymerizable substance comprises a silicone oil.

14. The invention according to claim 11, wherein said electron pattern is produced by projecting an electron beam through a masking member provided with openings corresponding to the desired pattern.

15. The invention according to claim 11, wherein said electron pattern is produced by scanning an electron beam across said metal member in accordance with a predetermined program.

References Cited in the file of this patent

UNITED STATES PATENTS

| | | |
|---|---|---|
| 2,668,133 | Brophy et al. | Feb. 2, 1954 |
| 2,673,142 | Glynn | Mar. 23, 1954 |
| 2,921,006 | Schmitz et al. | Jan. 12, 1960 |
| 2,967,241 | Hoecker et al. | Jan. 3, 1961 |